(12) United States Patent
Jung

(10) Patent No.: US 6,752,911 B2
(45) Date of Patent: Jun. 22, 2004

(54) DEVICE AND METHOD FOR COATING OBJECTS AT A HIGH TEMPERATURE

(75) Inventor: Thomas Jung, Hötzum (DE)

(73) Assignee: Fraunhofer-Gesellschaft zur Foerderung der Angewandten Forschung E.V. (DE)

( * ) Notice: Subject to any disclaimer, the term of this patent is extended or adjusted under 35 U.S.C. 154(b) by 0 days.

(21) Appl. No.: 10/149,170

(22) PCT Filed: Dec. 5, 2000

(86) PCT No.: PCT/EP00/12213

§ 371 (c)(1),
(2), (4) Date: Jul. 16, 2002

(87) PCT Pub. No.: WO01/40534

PCT Pub. Date: Jun. 7, 2001

(65) Prior Publication Data

US 2003/0057087 A1 Mar. 27, 2003

(30) Foreign Application Priority Data

Dec. 6, 1999 (DE) .......................... 199 58 643

(51) Int. Cl.⁷ .............................................. C23C 14/35
(52) U.S. Cl. ............................ 204/192.12; 204/192.13; 204/192.15; 204/192.16; 204/192.24; 204/298.03; 204/298.07; 204/298.09; 204/298.11; 204/298.14; 204/298.18; 204/298.19; 204/298.25
(58) Field of Search ....................... 204/298.25, 192.12, 204/192.15, 192.16, 192.24, 298.03, 192.13, 298.07, 298.09, 298.11, 298.14, 298.18, 298.19

(56) References Cited

U.S. PATENT DOCUMENTS

| | | | | |
|---|---|---|---|---|
| 3,294,669 A | * | 12/1966 | Theuerer | ............... 204/298.07 |
| 4,224,897 A | * | 9/1980 | Dugdale | ................ 204/298.07 |
| 4,236,994 A | | 12/1980 | Dugdale | .................... 204/298 |
| 4,290,875 A | * | 9/1981 | Duckworth | ............ 204/192.12 |
| 5,126,028 A | * | 6/1992 | Hurwitt et al. | ........ 204/192.13 |
| 5,135,629 A | * | 8/1992 | Sawada et al. | ........ 204/192.12 |
| 5,147,498 A | * | 9/1992 | Nashimoto | ............ 204/192.13 |

FOREIGN PATENT DOCUMENTS

| | | |
|---|---|---|
| DE | 196 32 410 C1 | 8/1996 |
| JP | 002166589 | 6/1980 |
| JP | 01232710 | 2/1998 |
| WO | WO 98/13531 | 9/1997 |

* cited by examiner

*Primary Examiner*—Rodney G. McDonald
(74) *Attorney, Agent, or Firm*—Young & Basile, P.C.

(57) ABSTRACT

The invention relates to a device for coating an object at a high temperature by means of cathode sputtering, having a vacuum chamber and a sputter source, the sputter source having a sputtering cathode. Inside the vacuum chamber is arranged an inner chamber formed from a heat-resistant material, which completely surrounds the sputtering cathode and the object to be coated, at a small spacing, and which has at least one opening to let a gas in and at least one opening to let a gas out.

42 Claims, 4 Drawing Sheets

DEVICE AND METHOD FOR COATING OBJECTS AT A HIGH TEMPERATURE

Figure 1:
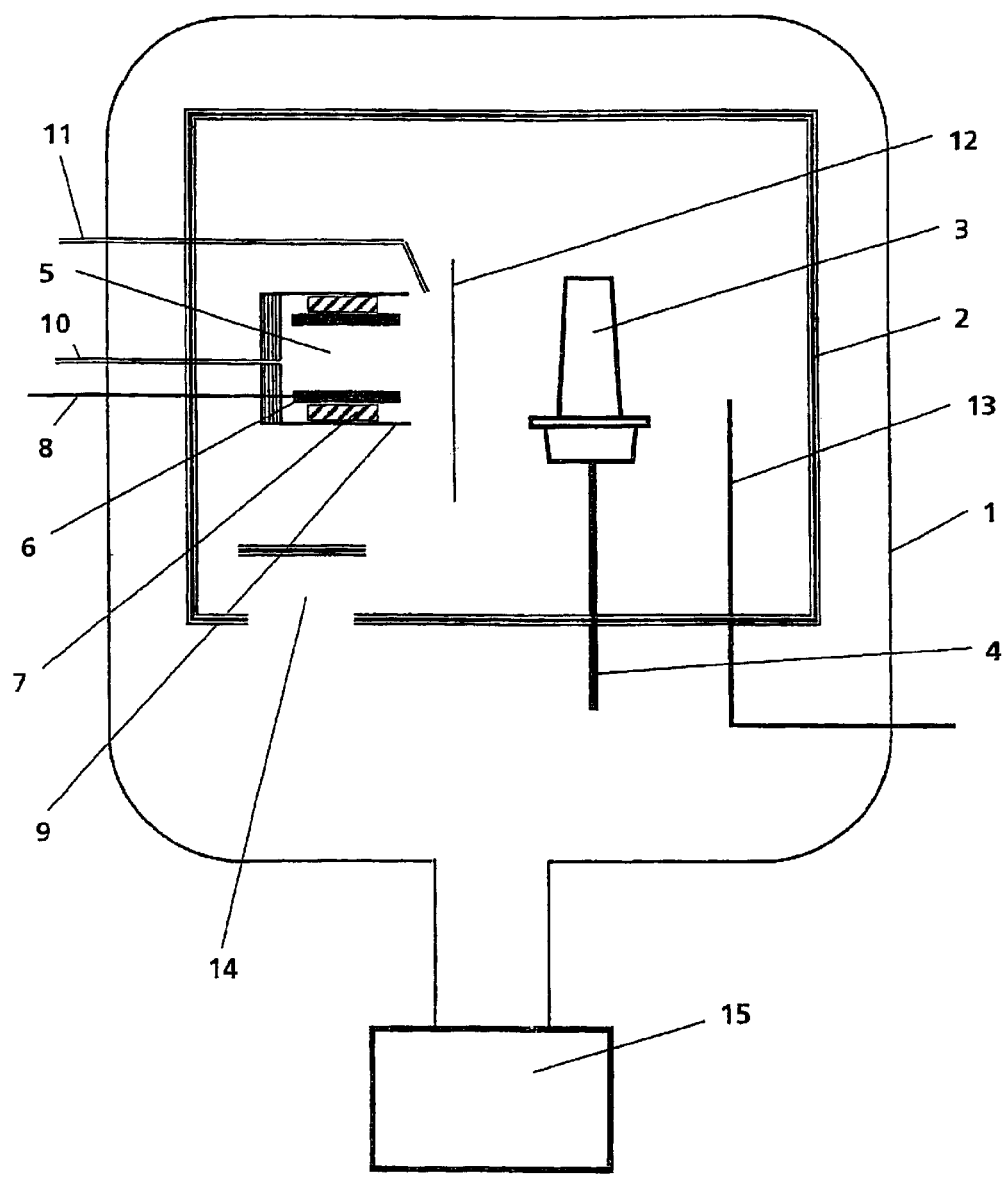

The present invention relates to a device and a method for coating an object at a high temperature. Such methods are used for the coating of objects, especially gas-turbine blades, for example with heat-insulating layers, anti-corrosion coatings and/or high-temperature superconducting layers.

Nowadays plasma-supported vacuum coating methods are used to coat objects with thin coatings. Amongst these methods is, for example, cathode sputtering which belongs to the group of PVD methods and as a result of its advantages, especially in comparison with the technically older thermal vapour deposition, has in the meantime found very wide application.

According to prior art, in most cases the coating of a substrate is carried out at room temperature or at only a slightly raised temperature. However there are fields of application in which, in order to form the desired layer structure, the temperature of the object to be coated (substrate) has to be very high during coating, for example 700° C. to 1100° C. This is the case, for example, in the production of high-temperature superconducting layers or anti-corrosion coatings and heat-insulating layers for gas-turbine components, especially turbine blades.

Various devices are known for coating substrates at a high temperature. From Müller et al, Praktische Oberflächentechnik (=Practical Surface Technology) Vieweg & Sohn Verlagsgesellschaft, Braunschweig, 1995, page 419, is known for example a magnetron sputter source, and from WO 98/13531 is known a gas-flow sputter source, in which the high temperature of the substrate is generated by means of an electrical resistance heater. This heater is preferably attached to the side of the substrate which is remote from the sputter source, in order to transfer the heat generated by it backwards onto the substrate by means of heat conduction or heat radiation.

Both of the sputter sources represented in these publications are high-speed sputter sources which up to now have also basically been operated with as low a target temperature as possible even in the case of a high substrate temperature. This is described for example in Kienel G. et al, Vakuumbeschichtung (=Vacuum coating) Volume 2, page 160 to 181. Therefore in the case of these conventional high-speed sputter sources the target is cooled. The prior art therefore usually naturally proceeds from water-cooling of the target.

The devices described in the above-mentioned documents have some serious disadvantages. For as a result of the heat radiation which grows very quickly with the substrate temperature and which is proportional to the fourth power of the absolute temperature, considerable energy losses occur as a result of radiation from the substrate towards the walls of the vacuum chamber and towards the sputter source. For this reason, the heater has to be designed for very high power and consumes correspondingly a great deal of energy. On the other hand intensive cooling, such as described above, has to be provided at the chamber wall and at the sputter target, which leads to high consumption of cooling water.

Efficient cooling of the sputter target (sputtering cathode) which is heated both by the gas discharge and by the hot substrate, presupposes very expensive manufacture (bonding) and requires considerable time outlay for the change of target when the target is consumed.

As a further disadvantage must be mentioned that, within the substrate, as a result of its limited thermal conductivity, there is uneven temperature distribution, such that no uniform coating properties can be guaranteed.

The object of the present invention, therefore, is to make available a device and a method for coating an object at a high temperature, in which the substrate can be heated simply, effectively and uniformly.

This object is accomplished by the device according to claim 1, the method according to claim 23 and by uses of this device and this method according to claims 35 to 39. Advantageous developments of the device according to the invention, of the method according to the invention and of the uses according to the invention are given in the dependent claims.

According to the invention, there is located in the interior of the vacuum chamber a coating chamber (inner chamber), the walls of which are formed from a heat-resistant material, preferably with low thermal conductivity, such as graphite or ceramics for example, or from a plurality of metal sheets with high reflecting power in the spectral range of the heat radiation of the target, and thus have a very high heat-insulating effect. The substrate (the object to be coated) and the sputter source (sputtering cathode) are entirely located inside this coating chamber. Advantageously, the walls of the inner chamber can comprise completely or also just in sections, an arrangement of a plurality of parallel metal sheets which are not in thermal contact with one another, or only slightly so. These can be, for example, flat sheets stapled with spacer pieces or also corrugated or embossed sheets. If corrugated or embossed sheets are used, no spacer pieces are required, since here the corrugation or the impressed nubs ensure the necessary spacing between adjacent sheets. The essential contribution to heat insulation is here provided by the vacuum or the rarefied gas between the metal sheets due to its low thermal conductivity. The walls of the inner chamber therefore comprise at least two metal sheets which touch one another at the most in places.

Furthermore, the coating chamber has openings to admit gas and for the extraction of gas, in order to feed in and extract the plasma-generating noble gas (for example argon) or other gases, for example during reactive sputtering.

A device of this type according to the invention does not require any expensive high-temperature heater to heat the substrate. For the operating conditions of the sputter source can be so selected that the target reaches a stationary temperature which is above, for example 50 K above, the desired substrate temperature. Thus the target (sputtering cathode) radiates heat radiation either directly or indirectly onto the substrate and thus heats up the substrate. Thus there is a reverse heat distribution and heat flow to that of the conventional high-speed sputtering methods. For in the latter the substrate is warmer than the cooled target and heats the latter up—in an undesired manner—whilst in the present invention the target is used as a heater for the substrate.

What is advantageous about this is that consequently no expensive high-temperature heater for the substrate is required. Furthermore, the energy consumption of the whole plant is significantly lower, since the heat losses to the wall of the vacuum chamber and to the sputter source are greatly reduced or disappear completely and moreover the required heating energy is obtained completely from the waste heat of the coating source.

Since the coating source now does not have to be cooled, the target's requirement of coolant is also significantly smaller. In particular no direct cooling is necessary any more for the sputter source. This considerably simplifies the entire construction, since on the one hand a uniformly good heat transition between target and cooling system is technically complicated and moreover the cooling system present at cathode potential disappears completely. Thus the electrically insulated water ducts for vacuum/air and the water-resistance to the potential adaptation also disappear.

As the sputtering cathode does not have to be cooled independently, manufacturing the sputtering cathode is also possible without bonding plates or bonding. Thus a target change can take place very quickly, reliably and simply.

In the case of a gas-flow sputter source, moreover, no additional shields are necessary on the outer sides of the target.

What is furthermore advantageous about the method according to the invention and the device according to the invention is that the substrate is heated very uniformly and from the side which is to be coated, and consequently uniform layer properties can also be achieved.

Advantageously, the operating conditions of the sputter source are so selected that the target reaches a stationary temperature which is at least 50 K above the desired substrate temperature. The sputter source can here be so designed that a sufficiently large proportion of the target surface passes its heat radiation predominantly directly, e.g. in the case of a magnetron sputter source, to the substrate or indirectly (e.g. in the case of a gas-flow sputter source) via reflection or absorption on the inner walls of the coating chamber.

The sputter source is advantageously so constructed that at this high temperature no negative changes occur which would impair the stable operation of the source. This means in particular the use of sufficiently heat-resistant materials and taking their thermal expansion into account. In the case of a magnetron sputter source, sufficient cooling of the magnets has to be ensured.

In the method according to the invention and the device according to the invention, the target temperature is adjusted according to a balance between a specific electrical power input into the gas discharge at the target on the one hand, and a specific heat extraction from the coating chamber on the other hand, for example by a defined heat-resistance of the coating chamber walls or of the target holder or of a heat-collecting shield optionally disposed in the vicinity of the target, via this shield's dimensions, position, orientation in the coating chamber and relative to the target or the substrate, and via its cooling power (shielding temperature) control of the heat extraction and thus of the substrate temperature is possible. The heat can then be passed on outside the coating chamber to a cooling fluid (e.g. water) or a cooling gas (e.g. air) via a heat exchange process. In the case where the substrate temperature has to have the high end temperature at the beginning of the coating process already, the sputter source is advantageously operated initially under conditions in which it only acts as a heating source but not as a coating source. This can come about for example by the working pressure in the vacuum chamber being so far increased that the mean free path of the sputtered particles is clearly shorter than the distance between the target and the substrate. Alternatively, between the target and the substrate in the initial phase a swivelling screen can also be swivelled in such that the direct rectilinear connection between sputtering cathode and substrate is interrupted. In the case of a gas-flow sputter source, the gas flow through the sputter source can also be reduced or switched off.

Particularly stable operation and uniform coatings can be realised if the temperature of the object to be coated is determined by means of a heat sensor, for example a thermocouple which is arranged in the vicinity of the substrate in the inner chamber. In this case, the substrate temperature can be controlled exactly via the power input in the sputter source.

Furthermore, bias voltage can be applied to the substrate in order to control exactly the properties of the coating deposited on the substrate.

The substrate temperature in the present method is in the range between 200 and 1500° C. The device according to the invention and the method according to the invention are particularly suitable for the following sputtering methods or sputter sources: gas-flow sputtering, hollow cathode sputtering, magnetron sputtering, diode sputtering or triode sputtering.

Thus substrates can be provided with heat-insulating layers, anti-corrosion coatings and/or high temperature conductive coatings, for example formed from refractory metals and/or compounds, e.g. oxides, nitrides, carbides or borides, for example zircon oxide, cerium oxide, MCrAlY alloys where M stands for a metal, or also YBaCuO.

The method according to the invention and the device according to the invention are particularly suitable for coating gas-turbine blades with heat-insulating layers or anti-corrosion coatings.

Some examples of devices and methods according to the invention are given below.

Figure 2:
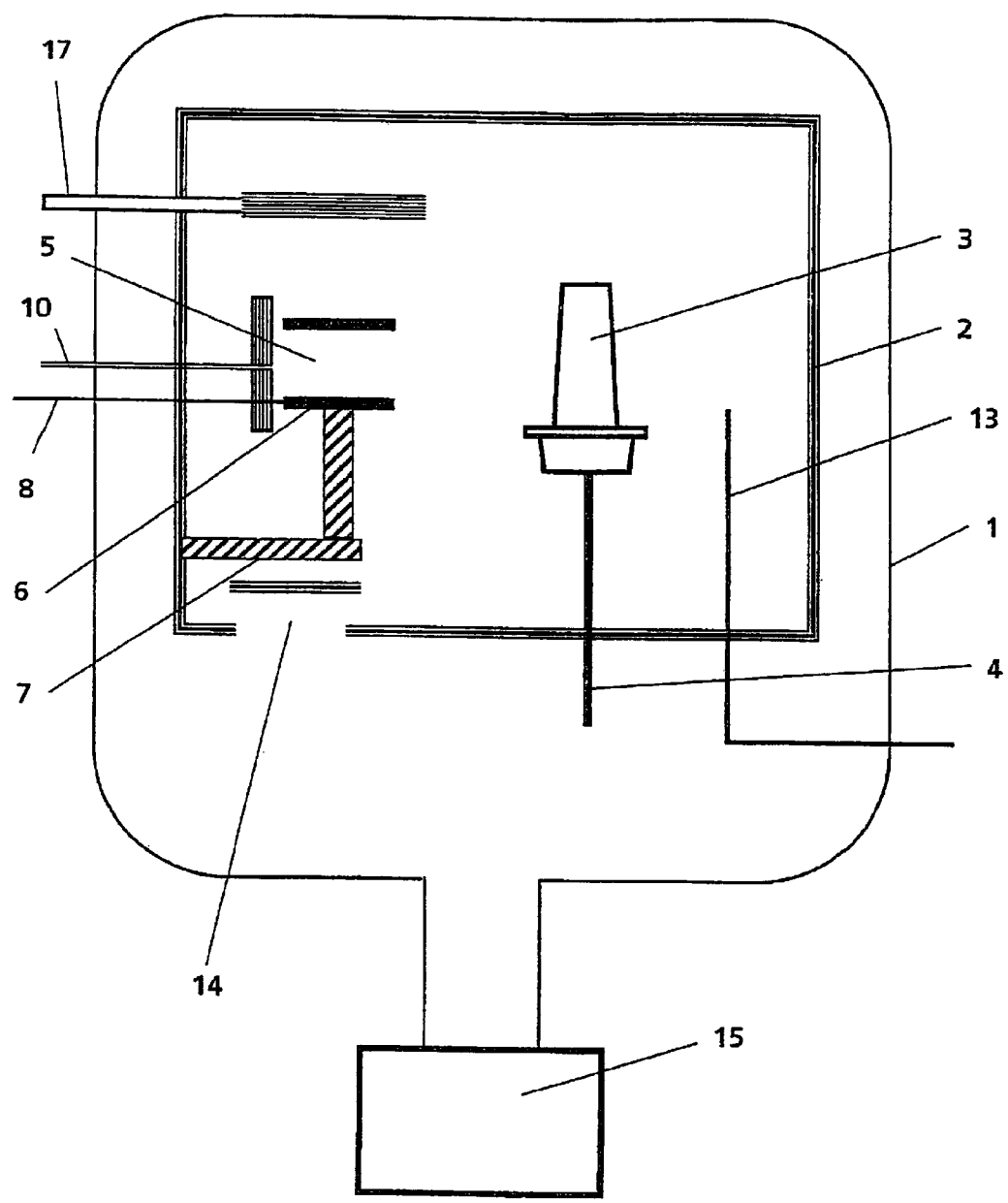
Figure 3:
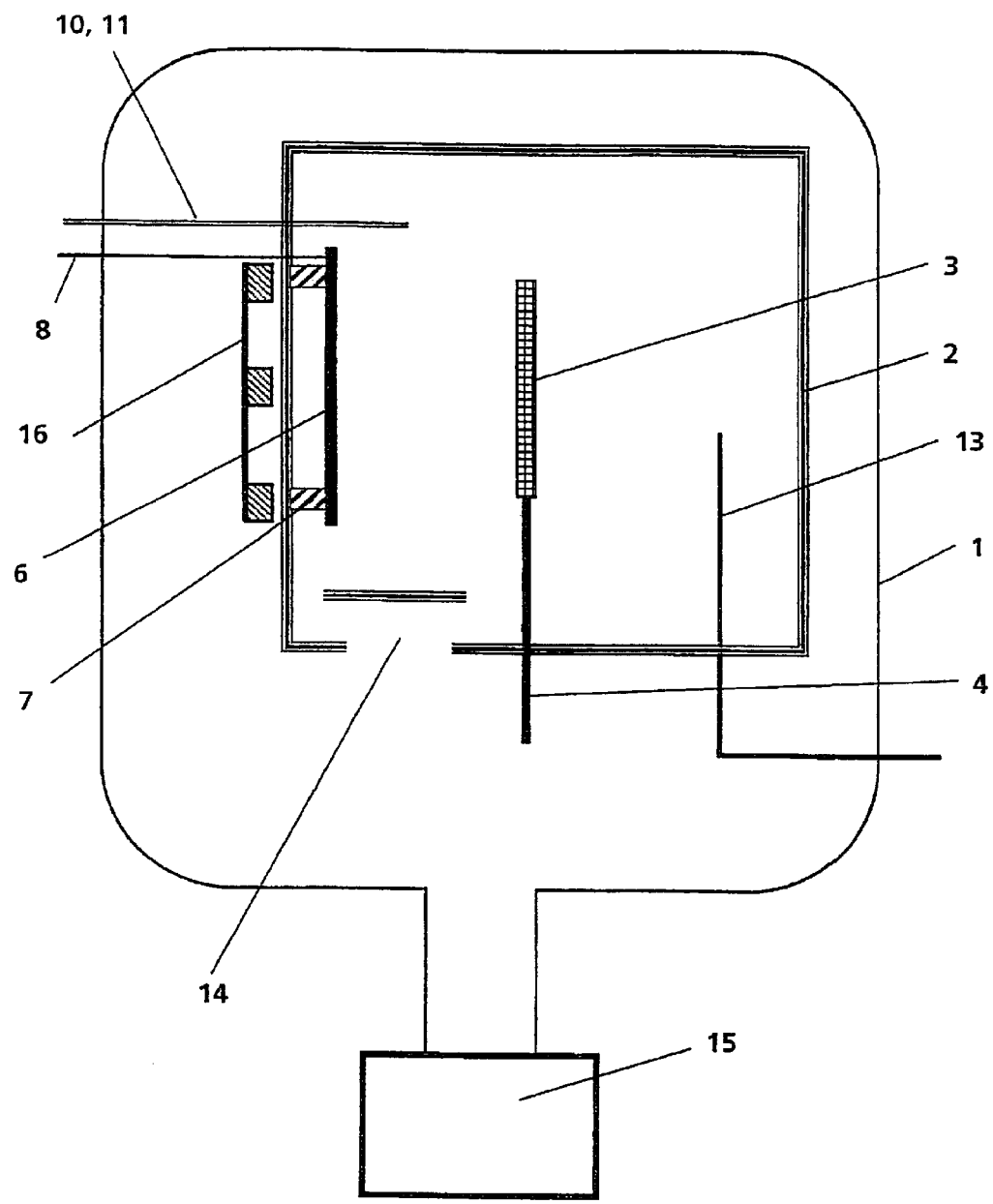
Figure 4:
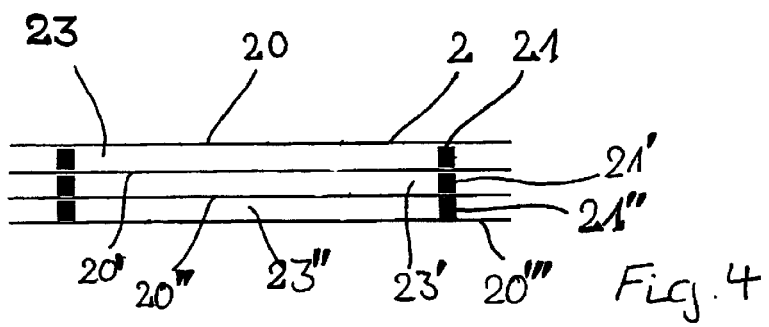
Figure 5:
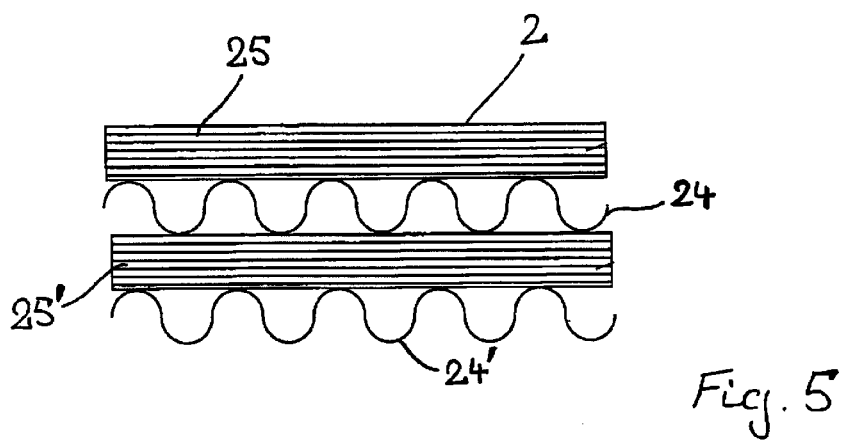

The figures show:

FIG. 1 a gas-flow sputter device;
FIG. 2 a gas-flow sputter device;
FIG. 3 a magnetron sputter device;
FIG. 4 the structure of an inner chamber wall;
FIG. 5 the structure of a further inner chamber wall and
FIG. 6 the structure of a further inner chamber wall.

FIG. 1 shows a gas-flow sputter device with a vacuum chamber 1 at which is arranged a vacuum pump 15 to evacuate the vacuum chamber 1. Inside the vacuum chamber 1 is located a coating chamber 2. This coating chamber has an extraction opening 14 in order to evacuate the interior of the coating chamber also. Preferably the vacuum chamber is cooled from outside, however cooling of the coating chamber is also possible—also from outside.

Inside the coating chamber 2 is disposed a gas-turbine blade 3 as a substrate on a substrate holder 4. Opposite the substrate 3 is located a gas-flow sputter source 5 with a target 6 (sputtering cathode), a target holder 7, an electrical target connection 8 and a target dark space shield 9. A feed line 10 for argon leads into the gas-flow sputter source 5. Furthermore a feed line 11 for oxygen leads into the coating chamber 2. Between the target 6 and the substrate 3 is arranged, moreover, a swivelling screen 12 which, at the beginning of the coating process, as long as the substrate is not yet warmed up, can be swivelled into the direct path between the target 6 and substrate 3 and can be removed from this path for the coating process. In the vicinity of the gas-turbine blade 3 is located a thermocouple 13, via which the temperature of the gas-turbine blade 3 can be determined.

The device shown in FIG. 1 can now be used for coating the gas-turbine blade 3, for example, with a zircon oxide layer by means of reactive gas-flow sputtering, the cathode being shielded towards the outside.

FIG. 2 shows a further example of a device for coating a gas-turbine blade; in this case a metal anti-corrosion coating can be deposited by means of gas-flow sputtering. The same elements as in FIG. 1 are provided in FIG. 2 with the same reference numerals and are therefore not described further.

In this case, the sputtering cathode is not shielded towards the outside. In the coating chamber 2 is arranged in addition a heat-collecting shield 17, via which the temperature in the coating chamber 2 and thus also the temperature of the substrate 3 can be regulated. For exact regulation of the temperature of the substrate, this heat-collecting shield can be cooled via a water-cooling system.

FIG. 3 shows a further device according to the invention for coating substrates with a YBaCuO coating by means of magnetron sputtering. In this case, too, the same elements as in FIG. 1 are provided with the same reference numerals and are not explained further. The sputter source in FIG. 3, in contrast to FIGS. 1 and 2, is not a gas-flow sputter source but a magnetron sputter source. Correspondingly, the sputter source is constructed from a target 6, which is secured to a target holder 7 and an electrical target connection 8, the sputter source having in addition a magnet 16. Argon or oxygen are fed in via feed lines which are designated with the reference numerals 10 or 11.

In all three embodiments of FIGS. 1 to 3, the temperature of the substrate 3 is determined by means of a thermocouple 13 and then the temperature of the target 6 is so controlled via the electrical power input into the gas discharge at the target 6 that the substrate 3 is brought to a defined temperature or is held at a defined desired temperature.

FIG. 4 shows a detail of a wall of an inner chamber according to the invention. This wall comprises here four flat metal sheets 20, 20', 20", 20''', which are held at a predetermined spacing from one another via spacer pieces 21, 21', 21". Between the flat sheets 20 to 20''', are consequently formed gaps 23, 23', 23", which can be filled for example with rarefied gas, i.e. under vacuum conditions. With such a structure of the wall of the inner chamber, the high heat insulation is achieved in a simple constructional manner, which is essential for the method according to the invention and for the device according to the invention. The spacer pieces 21, 21', 21" consist preferably of ceramics.

FIG. 5 shows a detail from a further inner chamber wall according to the invention. This comprises altogether four corrugated metal sheets 24, 24' and 25, 25', sheets 25 and 25' being disposed rotated by 90° in relation to sheets 24, 24' with respect to the longitudinal direction of the corrugations. By this means too, gaps are produced between the individual adjacent metal sheets which can be filled with rarefied gas and have a high heat-insulating effect.

Figure 6:
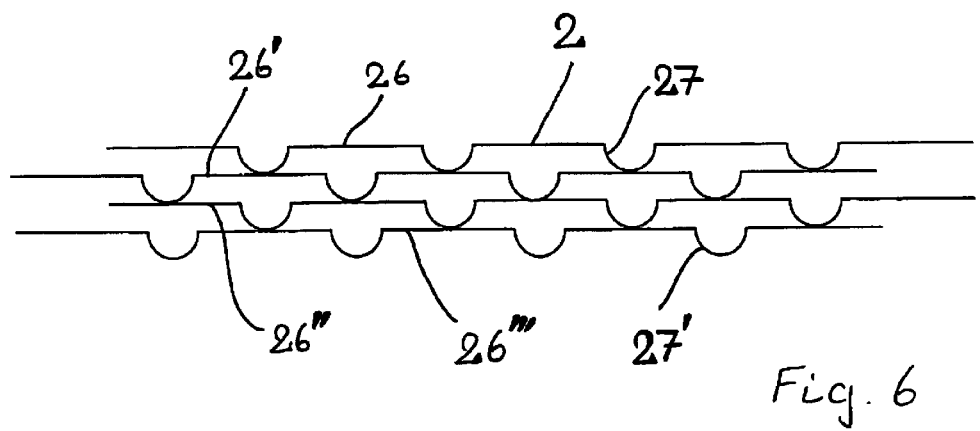

FIG. 6 shows a further inner chamber wall 2, which comprises altogether four embossed metal sheets 26, 26', 26", 26'''. These sheets have nubs 27, 27', the individual embossed sheets being so disposed on top of one another that the nubs of adjacent sheets do not engage in one another but act as spacers between one sheet and the adjacent sheet.

Some embodiments of the method according to the invention are given below.

In a first example a device, such as shown in FIG. 1 or 2, for coating gas-turbine blades is used at 1100° C. with yttrium-stabilised zircon oxide. To this end, first of all a gas-turbine blade to be coated is preheated to 400° C. and then inserted into the open vacuum chamber and the open coating chamber. After the coating chamber and the vacuum chamber have been closed, the latter are evacuated and then the gas-flow sputter source is operated exclusively as a heater. This is achieved by no working gas being led through the gas-flow sputter source. A plasma is admittedly now formed but there is no longer any material transport of sputtered cathode material to the substrate, since there is no gas flow through the source. Any sputtered material is consequently deposited again on the cathode surface without reaching the substrate.

Nevertheless, to heat up the target, argon is introduced into the inner chamber outside the gas-flow sputter source, such that a plasma for heating the target is formed. To save argon, the gas flow can be considerably reduced during heating-up, insofar as simultaneously the suction capacity of the vacuum pump is correspondingly reduced (e.g. by a throttle valve) so that nevertheless a sufficiently high pressure is produced for generating a plasma. In addition, in an optimal manner, a shield can be swivelled into the direct line between the target and substrate.

Once the temperature for coating the gas-turbine blade has been reached, the operation of the sputter source is switched over to operating as a coating source. To this end, argon is now no longer led outside the gas-flow sputter source into the inner chamber but the argon gas flow is led directly through the sputter source, and if necessary the swivelling shield is removed from the direct line between the target and substrate. Furthermore oxygen is fed separately into the coating chamber in the vicinity of the sputter source and the substrate in order to trigger reactive gas-flow sputtering.

During coating, the temperature of the gas-turbine blade is constantly measured via a thermocouple and the temperature of the gas-turbine blade is regulated by the sputter source power to approximately 1100° C.

Once the necessary coating thickness has been reached, the sputter source is switched off and a high cooling rate is set, by a gas pressure of 1 bar being set in connection with a high gas-flow rate in the coating chamber.

After the gas-turbine blade, which now has a coating of yttrium-stabilised zircon oxide, has cooled, it is removed from the vacuum chamber and the coating chamber and the chambers are then closed again.

In a further method example which can be implemented using a magnetron sputter source according to FIG. 3, a component to be coated as a substrate, which is at room temperature, is inserted into the open vacuum chamber and the open coating chamber and then both chambers are closed. Thereupon the two chambers are evacuated and the magnetron sputter source is operated solely as a heater. To this end, operating gas under high pressure, for example 0.1 mbar, is led into the vacuum chamber such that the sputtered particles, as a result of their small free path do not reach the substrate to be coated.

Once the coating temperature for the component has been reached, the sputter source is operated as a coating source. To this end, the pressure in the vacuum chamber and the coating chamber is reduced. Here, too, the temperature of the component is constantly measured again via a thermocouple and the temperature of the component is adjusted via the sputter source power to approximately 900° C. Using this method, CoCrAlY coatings can be applied to gas-turbine blades as the component by means of magnetron sputtering.

Once the necessary thickness of the CoCrAlY layers has been reached, the sputter source is switched off and the cooling rate is regulated by setting a gas pressure of 0.5 bar for moderate cooling.

After the gas-turbine blade has cooled, the latter is removed from the vacuum chamber and the coating chamber after they have both been opened and then both chambers are closed.

In a further method example, planar sapphire substrates are provided at 700° C. with a coating of YBaCuO by means of partially reactive hollow cathode sputtering.

First of all the sapphire substrate, which is at room temperature, is inserted into the open vacuum chamber and the open coating chamber, the two chambers are closed and evacuated. Then the hollow cathode sputter source is operated solely as a heater. To this end, a swivelling screen is inserted between the hollow cathode sputter source and the planar sapphire substrate, such that the sputtered particles of the sputter source are not deposited directly on the substrate. The substrate is, however, indirectly heated up via the walls of the coating chamber nevertheless.

Once the desired coating temperature of 700° C. has been reached, the swivelling screen between the sputter source and the substrate is removed, such that now the sputter source is operated as a coating source. Again, the temperature of the substrate is measured via a thermocouple and regulated via the sputter source power.

Once the necessary thickness of the YBaCuO coating has been reached, the sputter source is switched off. The oxygen partial pressure is maintained, however, and a low cooling rate is set by the gas pressure being held at 1 mbar.

Once the substrate has cooled, it is removed from the open vacuum chamber and the open coating chamber and both chambers are again closed.

What is claimed is:

1. Device for coating an object (3) at temperatures greater than 200° C. by means of cathode sputtering, having a vacuum chamber (1) and a sputter source (5), the sputter source having a sputtering cathode (6), characterised in that, inside the vacuum chamber is arranged an inner chamber (2) formed from a heat-resistant and heat-insulating material, which completely surrounds the sputtering cathode (6) and the object to be coated (3), and which has at least one opening (10, 11) to let a gas in and at least one opening (14) to let a gas out.

2. Device according to claim 1, characterised in that the material of the inner chamber (2) contains at least one of a graphite and a ceramic material.

3. Device according to claim 1, characterised in that the material of the inner chamber (2) is reflecting for heat radiation.

4. Device according to claim 1, characterised in that at least one wall of the inner chamber has, at least in regions, at least two metal layers, which are disposed parallel to one another and with gaps between the individual metal layers.

5. Device according to claim 4, characterised in that at least one of the at least two metal layers is a flat metal layer.

6. Device according to claim 4, characterised in that at least one of the at least two metal layers is a corrugated sheet or has a nub structure.

7. Device according to claim 4, characterised in that spacers are arranged between the at least two metal layers.

8. Device according to claim 4, characterised in that the gaps are one of filled with a rarefied gas and have a vacuum.

9. Device according to claim 1, characterised in that the sputtering cathode (6) and the object (3) are arranged in such a way that the surface of the sputtering cathode (6) radiates its heat radiation directly onto the object (3).

10. Device according to claim 1, characterised in that the sputtering cathode (6), the object (3) and the walls of the inner chamber (2) are arranged in such a way that the surface of the sputtering cathode (6) radiates its heat radiation indirectly via the walls of the inner chamber (2) onto the object (3).

11. Device according to claim 1, characterised in that the sputter source (5) comprises heat-resistant materials.

12. Device according to claim 1, characterised in that, at or on the object (3) is arranged a temperature sensor (13).

13. Device according to claim 12, characterised in that a control device is provided which controls the electrical power input into the gas discharge at the sputtering cathode (6) in dependence on the measurement signal of the temperature sensor (13).

14. Device according to claim 12, characterised in that a control device is provided, which controls the electrical power input into the gas discharge at the sputtering cathode (6) in dependence on the measurement signal of the temperature sensor (13), in such a way that the temperature of the object (3) is kept constant.

15. Device according to claim 1, characterised in that a movable screen (12) is arranged between the sputtering cathode (6) and the object (3).

16. Device according to claim 15, characterised in that the screen (12) is a swivelling screen.

17. Device according to claim 1, characterised in that a heat-collecting shield (17) is arranged in the inner chamber (2).

18. Device according to claim 1, characterised in that the walls of the inner chamber (2) have a specific heat resistance.

19. Device according to claim 1, characterised in that the sputter source (5) is a magnetron sputter source.

20. Device according to claim 19, characterised in that the magnet (16) of the magnetron sputter source (5) can be cooled.

21. Device according to claim 1, characterised in that the sputter source (5) is at least one of a gas-flow sputter source, a hollow cathode sputter source, a diode sputter source and a triode sputter source.

22. Method for coating an object (3) at a desired raised temperature of the object (3) by sputtering of a sputtering cathode (6) in a vacuum chamber (1), characterised in that the sputtering cathode (6) and the object (3) are arranged in an inner chamber (2), formed from heat-resistant and heat insulating material, which is disposed in the vacuum chamber (1) and completely surrounds the sputtering cathode (6) and the object (3), in such a way that heat radiation emitted by the sputtering cathode (6) is radiated onto the object (3) by at least one of direct radiation from the sputtering cathode and indirect radiation via the walls of the inner chamber (2), and the sputtering cathode (6) is operated in such a way that it reaches a temperature above the desired temperature.

23. Method according to claim 22, characterised in that the sputtering cathode (6) is operated in such a way that it has a temperature of at least 50° C. above the desired temperature.

24. Method according to claim 22, characterised in that a temperature between 200° C. and 1500° C. is reached as the desired temperature.

25. Method according to claim 22, characterised in that the temperature of the object (3) is detected and determined.

26. Method according to claim 25, characterised in that the electrical power input into the gas discharge at the sputtering cathode (6) is regulated in dependence on the temperature determined.

27. Method according to claim 22, characterised in that the sputtering cathode (6) is first operated under conditions in which it acts only as a heating source but not as a coating source, and once the object (3) has been heated up to the desired temperature, the sputtering cathode (6) is operated for coating.

28. Method according to claim 27, characterised in that, to operate the sputtering cathode (6) only as a heating source and not as a coating source, the working gas pressure in the vacuum chamber (1) is set in such a way that the average free path of the gas molecules or atoms is considerably smaller than the distance between the sputtering cathode (6) and the object (3).

29. Method according to claim 27, characterised in that, to operate the sputtering cathode (6) only as a heating source and not as a coating source, a swivelling screen (12) is introduced between the sputtering cathode (6) and the object (3).

30. Method according to claim 27, characterised in that, to operate the sputtering cathode (6) only as a heating source and not as a coating source, the gas flow through the vacuum chamber (1) is reduced or switched off.

31. Method according to claim 22, characterised in that the object (3) is first pre-heated outside the vacuum chamber (1) and is then introduced into the vacuum chamber (1) for coating.

32. Method according to claim 22, characterised in that the object (3) is placed under a bias voltage during the coating.

33. Method according to claim 32, characterised in that the bias voltage is controlled in dependence on the desired properties of the coating.

34. Use of a device according to claim 1 for coating objects (3) with at least one of a heat-insulating layer, anti-corrosion coating, and heat-resistant superconducting layer.

35. Use of a device according to claim 1, for coating objects (3) with at least one of a refractory metal and refractory compound.

36. Use of a device according to claim 1 for coating objects (3) with at least one of an oxide, nitride, carbide, and boride.

37. Use of a device according to claim 1 for coating objects (3) with at least one of a zircon oxide, cerium oxide, MCrAlY alloy, M being a metal, and YBaCuO.

38. Use of a method according to claim 34 for coating a gas-turbine blade.

39. Use of a method according to claim 22 for coating an object (3) with at least one of a heat-insulating layer, anti-corrosion coating, and heat-resistant superconducting layer.

40. Use of a method according to claim 22 for coating an object (3) with at least one of a refractory metal and refractory compound.

41. Use of a method according to claim 22 for coating an object (3) with at least one of oxide, nitride, carbide, and boride.

42. Use of a method according to claim 22 for coating an object (3) with at least one of zircon oxide, cerium oxide, MCrAlY alloy, M being a metal, and YBaCuO.

* * * * *